US009121917B2

(12) United States Patent
Song et al.

(10) Patent No.: US 9,121,917 B2
(45) Date of Patent: Sep. 1, 2015

(54) CEST PHASE AND MAGNITUDE IMAGING USING A MULTI-PARAMETRIC VARIED SATURATION SCHEME

(75) Inventors: Xiaolei Song, Lutherville-Timonium, MD (US); Jeff W. M. Bulte, Fulton, MD (US); Assaf A. Gilad, Baltimore, MD (US); Michael T. McMahon, Columbia, MD (US)

(73) Assignees: The Johns Hopkins University, Baltimore, MD (US); Kennedy Krieger Institute, Inc., Baltimore, MD (US)

( * ) Notice: Subject to any disclaimer, the term of this patent is extended or adjusted under 35 U.S.C. 154(b) by 0 days.

(21) Appl. No.: 13/452,221

(22) Filed: Apr. 20, 2012

(65) Prior Publication Data

US 2012/0271159 A1 Oct. 25, 2012

Related U.S. Application Data

(60) Provisional application No. 61/477,442, filed on Apr. 20, 2011.

(51) Int. Cl.
*A61B 5/055* (2006.01)
*G01R 33/56* (2006.01)
*G01R 33/483* (2006.01)

(52) U.S. Cl.
CPC ........ *G01R 33/5601* (2013.01); *G01R 33/4838* (2013.01); *G01R 33/5605* (2013.01)

(58) Field of Classification Search
CPC .......................................... A61B 5/055
USPC .................. 600/407, 410, 420, 425, 431
See application file for complete search history.

(56) References Cited

U.S. PATENT DOCUMENTS

| 6,943,033 B2* | 9/2005 | Van Zijl et al. ............... 436/173 |
|---|---|---|
| 7,310,547 B2* | 12/2007 | Zelenchuk .................... 600/407 |
| 8,306,603 B2* | 11/2012 | Willard et al. ............... 600/420 |
| 2004/0162478 A1* | 8/2004 | Thesen ......................... 600/410 |

\* cited by examiner

*Primary Examiner* — Peter Luong
(74) *Attorney, Agent, or Firm* — Johns Hopkins Technology Transfer

(57) ABSTRACT

An embodiment in accordance with the present invention provides a method for obtaining a magnetic resonance image (MRI) or spectrum. The method includes a step of performing a chemical exchange saturation transfer (CEST) or magnetization transfer (MT) magnetic labeling experiment of a subject using an MRI machine. When performing the CEST or MT magnetic labeling experiment aspects of a saturation pulse or a serial saturation pulse sequence, such as length ($t_{sat}$), number ($N_{sat}$), offset ($\Delta\omega$), modulation frequency ($\omega_s$) and power ($B_1$) can be varied in specific-designed schemes. Data is generated from the CEST magnetic labeling experiment and is transmitted to a data processing unit. The data is processed to generate a visual representation of the data.

27 Claims, 8 Drawing Sheets

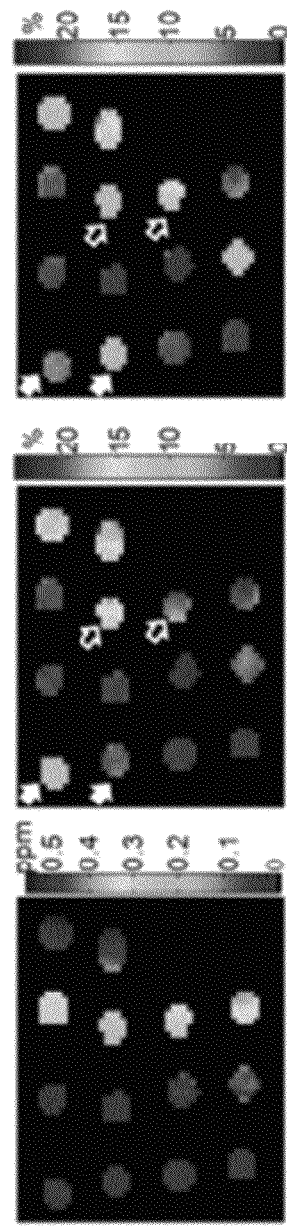
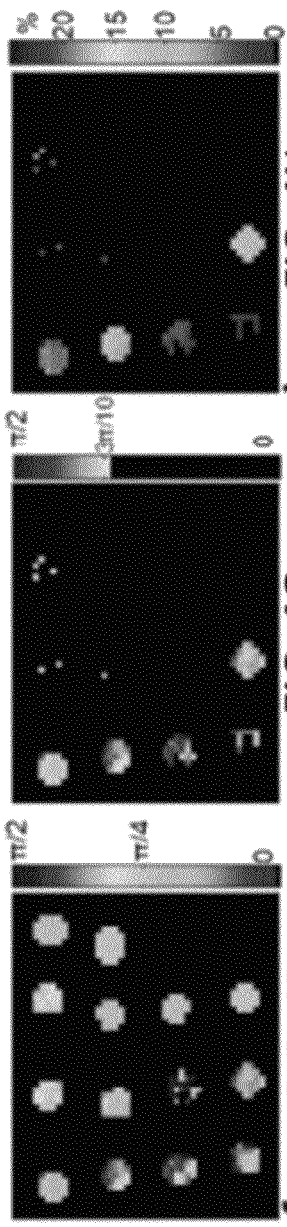
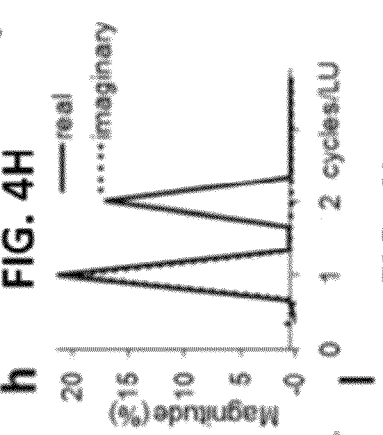
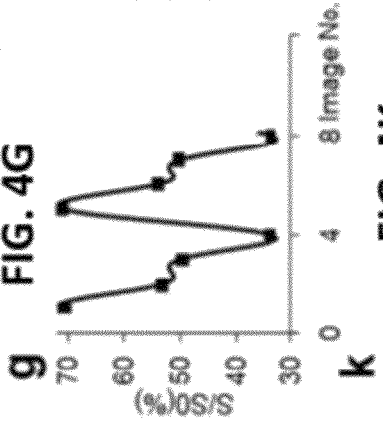
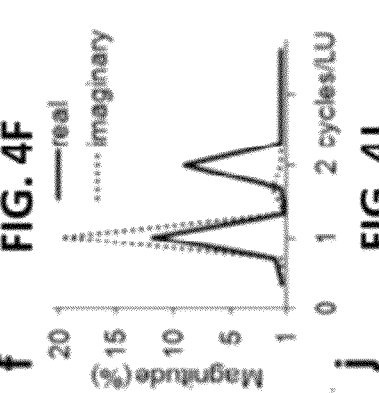
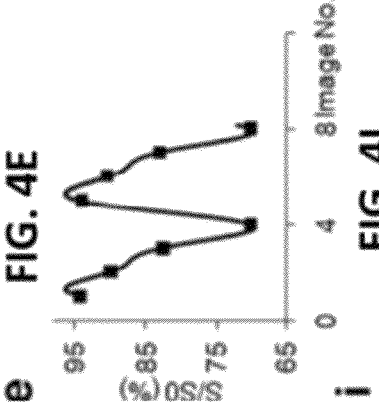

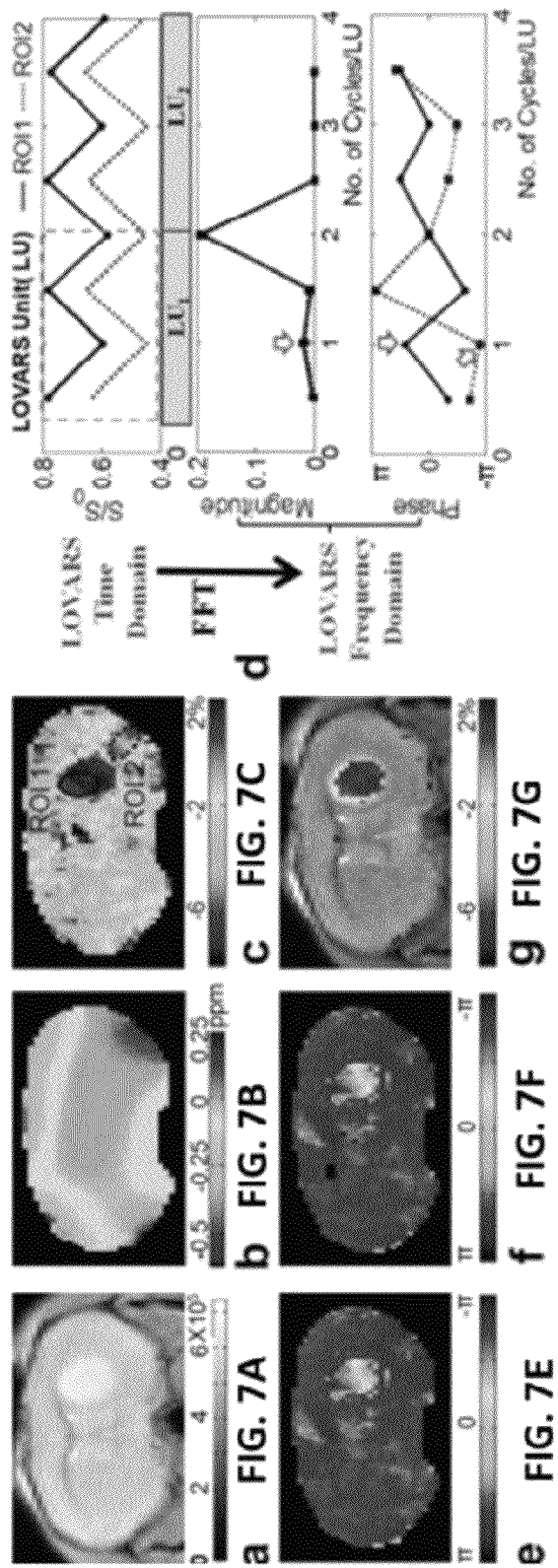

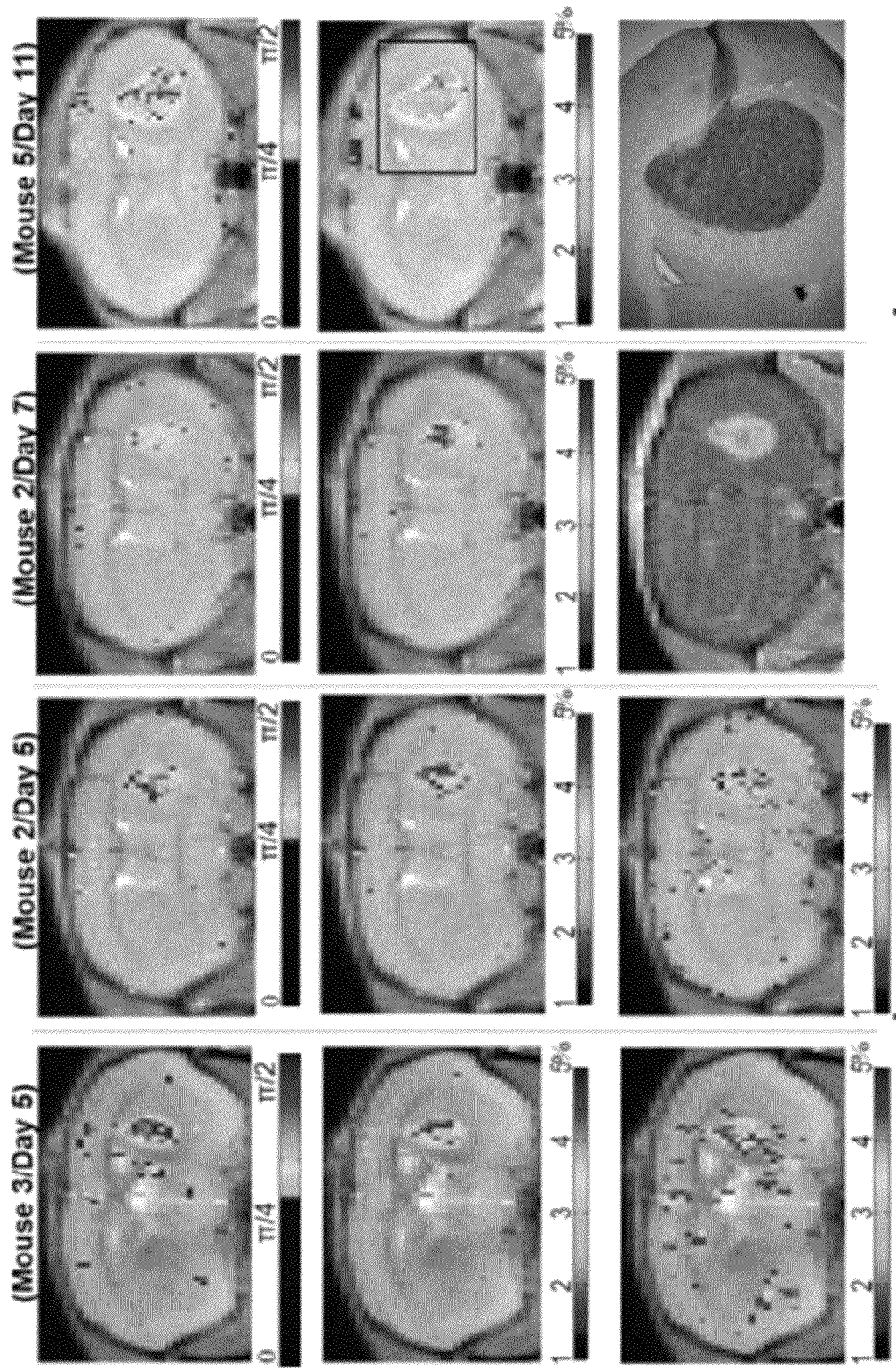

CEST PHASE AND MAGNITUDE IMAGING USING A MULTI-PARAMETRIC VARIED SATURATION SCHEME

CROSS REFERENCE TO RELATED APPLICATIONS

This application claims the benefit of U.S. Provisional Patent Application No. 61/477,442 filed Apr. 20, 2011, which is incorporated by reference herein, in its entirety.

GOVERNMENT SUPPORT

This invention was made with government support under R21EB005252, R21EB008769, R21NS065284, R01E012590, R01EB015031, and R01E13015032 awarded by the National Institutes of Health. The government has certain rights in the invention.

FIELD OF THE INVENTION

The present invention relates generally to medical imaging. More particularly, the present invention relates to a method of magnetic resonance imaging.

BACKGROUND OF THE INVENTION

Since the first report of chemical exchange saturation transfer (CEST) contrast in 2000, this imaging technology has attracted many new research studies, resulting in a number of preclinical and now also clinical applications. Endogenous CEST contrast has been applied to characterizing acute ischemia and brain tumors, visualizing the concentration of tissue amide protons and their chemical exchange rate. CEST contrast has been found to relate to tumor grade, and allows separation of recurrent tumor from the effects of treatment. This contrast is also used in musculoskeletal imaging for monitoring glycosaminoglycan concentrations in cartilage. In addition, CEST reporter genes are being developed allowing detection of cells expressing this gene.

An important advantage of CEST is the capability to design agents with protons at different frequencies, allowing simultaneous detection of probes with different functions. CEST probes have been designed to label virus particles, allow imaging of the kidneys, and allow the detection of peptides, drug delivery particles, changes in temperature, pH, and metabolite concentrations. Ultimately, for both endogenous and exogenous CEST contrast agent studies, improved detection technologies will be important to speed up the transition to widespread preclinical and clinical use.

CEST contrast is produced through the application of a radiofrequency saturation pulse at the resonance frequency of the exchangeable protons, after which the resulting saturation is transferred via chemical exchange to bulk water leading to a loss in signal that yields contrast. However, the application of this pulse results in other sources of water signal loss, such as due to conventional magnetization transfer contrast (MTC, mainly from solid-like macromolecules in tissue) and direct saturation (DS), complicating image analysis. To analyze the sources of water signal loss, it is widespread practice to plot the saturated water signal intensity (S) normalized with the intensity without saturation ($S_0$) as a function of saturation offset with respect to water, termed a Z-spectrum. As shown in FIGS. 1A-1C, the symmetries of the DS and MTC signals with respect to the water frequency (assigned to 0 ppm) differ from CEST. Because CEST contrast is asymmetric with respect to the water frequency, the conventional way to detect and quantify CEST contrast has been by calculating the asymmetry in the magnetization transfer ratio ($MTR_{asym}$) at the frequency of the exchangeable protons($\Delta\omega$):

$$MTR_{asym} = \frac{(s(-\Delta\omega) - s(+\Delta\omega))}{s0} \quad (1)$$

FIGS. 1A-1C illustrate simulations of the Z-spectra produced by solutions containing either CEST (PLL or L-arginine) or conventional MTC agents (agar) to display the symmetries of the various contributions to saturation signal loss. More particularly, FIG. 1A illustrates a Z-spectrum of PLL (solid line) in PBS and second without contrast agent (dash line). FIG. 1B illustrates a Z-spectrum for L-arginine (solid line) in PBS and second without contrast agent (dash line), and FIG. 1C illustrates a Z-spectrum for 2% Agar (solid line) in PBS and second without contrast agent (dash line).

The proton transfer ratio (PTR) is a metric used to describe CEST contrast for a certain proton type in a given agent. Unfortunately, the standard assumption that the experimentally determined $MTR_{asym}$ equals PTR is not valid as MTC may have an inherent asymmetric component ($MTR_{asym}^{inherent}$). Moreover, the spatial inhomogeneity of magnetic field results in water frequency variations and produces artifacts ($MTR_{asym}^{field}$). Therefore, the experimentally measured asymmetry is given by:

$$MTR_{asym} = PTR + MTR_{asym}^{field} + MTR_{asym}^{inherent} \quad (2)$$

Errors in $MTR_{asym}$ due to $MTR_{asym}^{field}$ contributions can be reduced by mapping the field and performing a voxel-based offset correction, which are categorized as offset incrementation correction (OIC) methods. Mapping the field can be accomplished through fitting the Z-spectrum for each pixel or through gradient echo based methods or fitting Z-spectra acquired using short, weak saturation pulses. The corrected contrast map is generated by acquiring a reduced number of images with frequencies around the proton of interest. Such types of either partial or whole Z-spectra acquisition require relatively long scan times and have the disadvantage that the CNR of the contrast map does not increase as the number of offsets and the scan time increase. To partially compensate for this, CEST contrast can also be calculated by integrating over the width of the CEST peak or using a Lorentzian line-fitting, but still require sweeping the offset over a wide range. Recently an additional method has been proposed which utilizes two saturation frequency alternating to cancel out the $MTR_{asym}^{field}$ and $MTR_{asym}^{inherent}$.

It would therefore be advantageous to provide a method of MRI which an aspect of the saturation pulse is varied to modulate the water signal loss, such as using cosine modulation and impart differential phases on the three different components of the asymmetric MTR contributions (PTR, ($t_{sat}$), and ($\Delta\omega$)). This allows their separation using post-processing techniques similar to those for analyzing time-varying signals in fMRI and other imaging moiety, such as the general linear model (GLM) to identify modulation patterns, fast fourier transform (FFT) to separate different frequency components or pattern recognition method, such as principal component analysis, independent component analysis and fuzzy analysis.

SUMMARY OF THE INVENTION

The foregoing needs are met, to a great extent, by the present invention, wherein in one aspect, a method for obtaining a magnetic resonance image (MRI) or spectrum includes performing a chemical exchange saturation transfer (CEST) magnetic labeling experiment or a Magnetization Transfer labeling experiment of a subject using an MRI machine over a period of time. The method further includes varying an aspect of a saturation pulse or serial pulse sequence scheme applied by the MRI machine during the period of time for performing the CEST magnetic labeling experiment or Magnetization Transfer labeling experiment of the subject. Data is generated from the magnetic labeling MRI experiment and transmitting to a data processing unit. The data processing unit processes the data and generates a visual representation of the data.

In accordance with another aspect of the present invention, the visual representation of the data includes a multi-dimensional parametric fingerprint to describe the CEST or ParaCEST moiety. Varying the aspect can include but is not limited to any one of the following: varying a length ($t_{sat}$) and an offset ($\Delta\omega$) of the saturation pulse, a length ($t_{sat}$) of the saturation pulse, varying the number of pulses ($N_{sat}$) and an offset ($\Delta\omega$) of the serial pulse sequence scheme, varying a modulation frequency ($\omega_s$) and a length (60 of the saturation pulse such that single or multiple frequencies are obtained simultaneously, varying a modulation frequency ($\omega_s$) and a number of pulses ($N_{sat}$) of a serial saturation pulse sequence scheme, such that single or multiple frequencies are obtained simultaneously, varying a modulation frequency ($\omega_s$) and an offset ($\Delta\omega$) such that single or multiple frequencies are obtained simultaneously, varying a modulation frequency ($\omega_s$) and a power ($B_1$) of the saturation pulse such that single or multiple frequencies are obtained simultaneously, varying a modulation frequency ($\omega_s$) such that single or multiple frequencies are obtained simultaneously, varying a power ($B_1$) and an offset ($\Delta\omega$) of a saturation pulse, and varying a power ($B_1$) of the saturation pulse.

In accordance with another aspect of the present invention, the method can include identifying modulation patterns using a pattern recognition method such as principal component analysis, independent component analysis and fuzzy analysis. Identifying modulation patterns can also be done using a general linear model and separating different frequency components can be done using a fast fourier transform (FFT). The method can also include enhancing the detection of the CEST signal and separation from noise using principle component analysis to extract a CEST moiety specific multiparametric fingerprint pattern that is specific to multiple varying saturation serial pulse sequence schemes.

In accordance with yet another aspect of the present invention, the method can further include manipulating the aspect of the saturation pulse or serial pulse sequence scheme in an aspect unit and collecting one or more total aspect units during the period of time for performing the CEST magnetic labeling experiment or magnetization transfer experiment. A series of images can be acquired using N aspect units with one or more images within each aspect unit. One or more offsets selected from one of a group consisting of frequencies on a same side as water and in resonance with an exchangeable proton and frequencies on an opposite side of water from the exchangeable protons, can also be varied. The saturation pulse is used to saturate the sample in a spatially and time selective method using a multi-transmitter and a multi-receiver platform. Additionally, the method can include acquiring at least one of a voxel, part of an image, or one more slices of a multi-slice 2D or 3D acquisition. Smaller changes can further be extracted by taking the subtraction of generated images or by acquiring a reference image for a baseline.

BRIEF DESCRIPTION OF THE DRAWINGS

The accompanying drawings provide visual representations which will be used to more fully describe the representative embodiments disclosed herein and can be used by those skilled in the art to better understand them and their inherent advantages. In these drawings, like reference numerals identify corresponding elements and:

FIGS. 4A-4L illustrate in vitro test of the performance of the LOVARS phase mapping scheme.

FIGS. 7A-7G illustrate in vivo demonstration of the LOVARS scheme as applied to the imaging of 9L gliosarcomas in mice.

FIGS. 8A-8D illustrate four representative LOVARS phase and imaginary component maps acquired 5, 7, and 11 days after tumor engraftment compared with other methods.

DETAILED DESCRIPTION

Figures 1A, 1B, 1C:
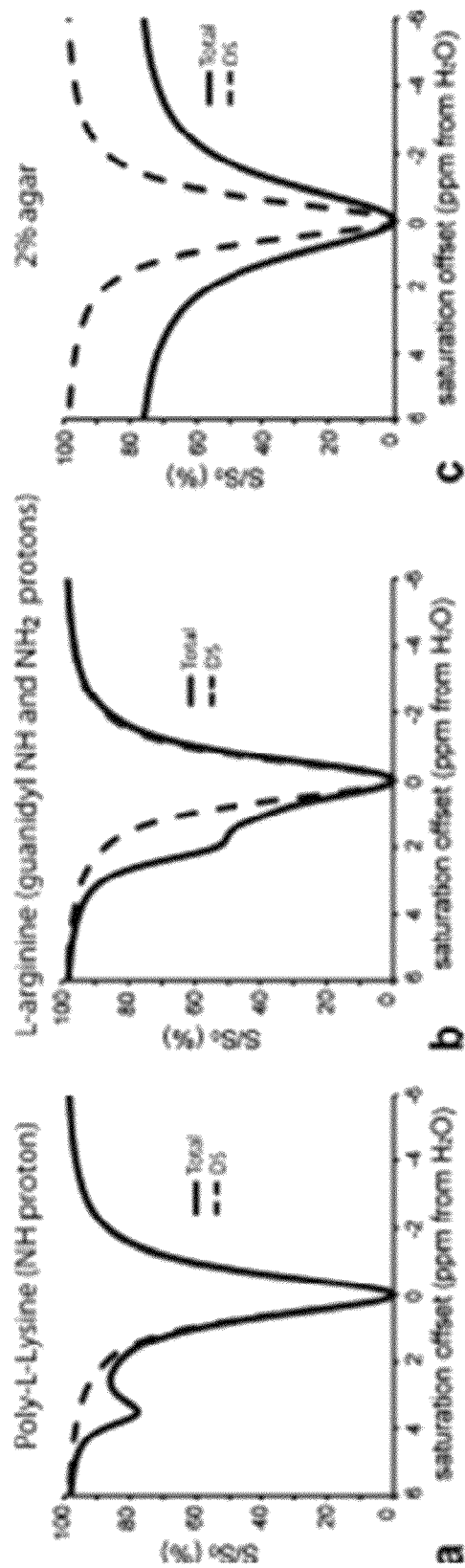
FIGS. 1A-1C illustrate simulations of the Z-spectra produced by solutions containing either CEST (PLL or L-arginine) or conventional MTC agents (agar) to display the symmetries of the various contributions to saturation signal loss.

The presently disclosed subject matter now will be described more fully hereinafter with reference to the accompanying Drawings, in which some, but not all embodiments of the inventions are shown. Like numbers refer to like elements throughout. The presently disclosed subject matter may be embodied in many different forms and should not be construed as limited to the embodiments set forth herein; rather, these embodiments are provided so that this disclosure will satisfy applicable legal requirements. Indeed, many modifications and other embodiments of the presently disclosed subject matter set forth herein will come to mind to one skilled in the art to which the presently disclosed subject matter pertains having the benefit of the teachings presented in the foregoing descriptions and the associated Drawings. Therefore, it is to be understood that the presently disclosed subject matter is not to be limited to the specific embodiments disclosed and that modifications and other embodiments are intended to be included within the scope of the appended claims.

An embodiment in accordance with the present invention provides a method for obtaining a magnetic resonance image (MRI) or spectrum. The method includes a step of performing a chemical exchange saturation transfer (CEST) magnetic labeling experiment of a subject using an MRI machine over a period of time. During the period of time for performing the CEST magnetic labeling experiment an aspect of a saturation pulse or series pulse sequence applied by the MRI machine can be varied. Data is generated from the CEST magnetic labeling experiment and is transmitted to a data processing unit. The data is processed to generate a visual representation of the data.

Varying the aspect of the saturation pulse or the serial pulse sequence scheme can include but is not limited to any one of the following: a Length (tsat) and an Offset ($\Delta\omega$) of VARied Saturation (LOVARS), a Length (tsat) VARied (L-VARS), the Number of pulses (Nsat) and an Offset ($\Delta\omega$) VARied Saturation (NOVARS), the Number of pulses (Nsat) VARied Saturation (N-VARS),an Power (B 1) and an Offset (Δω) VARied Saturation (POVARS), an Power (B1) VARied Saturation (P-VARS), a Modulation frequency ($\omega_s$) and an offset (Δω) VARied Saturation (MOVARS) such that modulated single or multiple frequencies are obtained simultaneously, a Modulation frequency ($\omega_s$) and a Length ($t_{sat}$) VARied Saturation (M-LVA.RS) such that modulated single or multiple frequencies are obtained simultaneously, a Modulation frequency ($\omega_s$) and a Length ($t_{sat}$) and an Offset VARied Saturation (M-LOVARS) such that modulated single or multiple frequencies are obtained simultaneously, a Modulation frequency ($\omega_s$) and the Number of pulses ($N_{sat}$) VARied Saturation (M-NVARS) such that modulated single or multiple frequencies are obtained simultaneously, a Modulation frequency ($\omega_s$) and the Number of pulses ($N_{sat}$) and an Offset VARied Saturation (M-NOVARS) scheme such that modulated single or multiple frequencies are obtained simultaneously, a Modulation frequency ($\omega_s$) and an Power (B1) and an Offset VARied Saturation (M-POVARS) scheme such that modulated single or multiple frequencies are obtained simultaneously, a Modulation frequency ($\omega_s$) and an Power (B1) VARied Saturation (M-PVARS) scheme such that modulated single or multiple frequencies are obtained simultaneously. These aspects are listed as examples and any other way of varying the saturation pulse or serial pulse sequence scheme known to one of skill in the art could be used.

The aspects listed above, such as LOVARS, L-VARS, NOVARS, N-VARS, MOVARS, M-LVARS, M-NVARS, M-PVARS, M-VARS, POVARS, and P-VARS can be manipulated in a predetermined scheme referred to as an aspect unit. These aspect units can also be referred to, more particularly, as LOVARS units, LVARS units, NOVARS units, NVARS units, M-LVARS units, M-NVARS units, MOVARS units, M-PVARS units, M-VARS units, POVARS units, and P-VARS units. One or more of these aspect units can be collected during the period of time for performing the CEST or magnetization transfer experiment. One or more images can be acquired during one or more aspect units.

By way of example, this invention will be described with reference to varying the LOVARS aspect, defined above, in a CEST magnetic labeling experiment. Aspect units will therefore be measured and described as LOVARS units. This is not to be considered limiting, as any of the aspects described above could be employed in either a CEST or magnetization transfer magnetic labeling experiment, to execute the methods described and claimed herein. More particularly, the method includes the use of several equations to describe the method as well as the results of a CEST magnetic labeling experiment done according to an embodiment of the method. These equations are discussed in more detail, below. The sources of water signal loss upon application of a saturation pulse (MTC, PTR, DS) can be described using modified Bloch equations. The $t_{sat}$-dependence of CEST contrast (PTR) can be modeled using the following equation:

$$PTR(t_{sat}) = \frac{k_{sw} \times \alpha \times X_s}{R_{1w} + k_{sw} \times X_s} \times [1 - e^{-(R_{1w} + k_{sw} \times X_s)t_{sat}}] \quad (3)$$

with $k_{sw}$ being the unidirectional exchange rate from solute protons to water protons, $X_s$ being the concentration of the solute exchangeable protons, $R_{1w}$ being the spin-lattice relaxation rate of water, and α being the saturation efficiency. This expression has been used to measure $k_{sw}$ for poly-L-lysine (PLL), dendrimers, and other CEST agents in vitro based on this exponential buildup as a function of $t_{sat}$.

Saturation pulses also produce a direct loss in water magnetization due to saturation of water protons. The longitudinal magnetization after applying an radiofrequency pulse in the absence of CEST agent can be modeled:

$$M_2(t_{sat}) = \frac{[(R_2 + \alpha_1)^2 + \Delta_\omega^2](R_1 + \alpha_1)}{\alpha_1(\alpha_1 - \alpha_2)(\alpha_1 - \alpha_3)}e^{\alpha_1 \times t_{sat}} + \cos\left(\frac{\sqrt{3}}{2}(A-B)\right) \quad (4)$$

$$\frac{[(R_2 + \alpha_2)^2 + \Delta_\omega^2](R_1 + \alpha_2)}{\alpha_2(\alpha_2 - \alpha_1)(\alpha_2 - \alpha_3)}e^{\left[\frac{(-2R_2 - R_1)}{3}\frac{A-B}{2}\right]t_{sat}}$$

where $$\alpha_1 = \frac{-2(R_2 + R_1)}{3} + A + B,$$

$$\alpha_2 = \left[\frac{-2(R_2 + R_1)}{3} - \frac{A+B}{2}\right] + i\frac{\sqrt{3}}{2}(A - B) \text{ and,}$$

$$\alpha_3 = \alpha_2^*, \text{ in which}$$

$$A = \left[-\frac{b}{2} + \sqrt{c}\right]^{\frac{1}{3}}, B = \left[\frac{b}{2} - \sqrt{c}\right]^{\frac{1}{3}},$$

$$b = \frac{1}{27}(R_1 - R_2)[2(R_1 - R_2)^2 + 18(\Delta\omega)^2 - 9\omega_1^2],$$

$$c = \frac{1}{27}\bigg\{[(\Delta\omega)^2 + \omega_1^2]^3 +$$

$$(R_1 - R_2)^2(2(\Delta\omega)^2 + (R_1 - R_2)^2] - \omega_1^2\left[\frac{\omega_1^2}{4} + 5(\Delta\omega)^2\right]\bigg\}.$$

Equation 4 shows that the buildup of DS with $t_{sat}$ is related to the relaxation rates for water ($R_1$, $R_2$), Δω, and $\omega_1$. As shown in Eqs. 3 and 4, the PTR and DS contrast dependencies on $t_{sat}$ are different and MTC also possesses a different dependence on $t_{sat}$.

Figure 2A:
FIGS. 2A-2C illustrate the LOVARS acquisition scheme depicting the oscillation patterns produced in water signal.
Figure 2B:
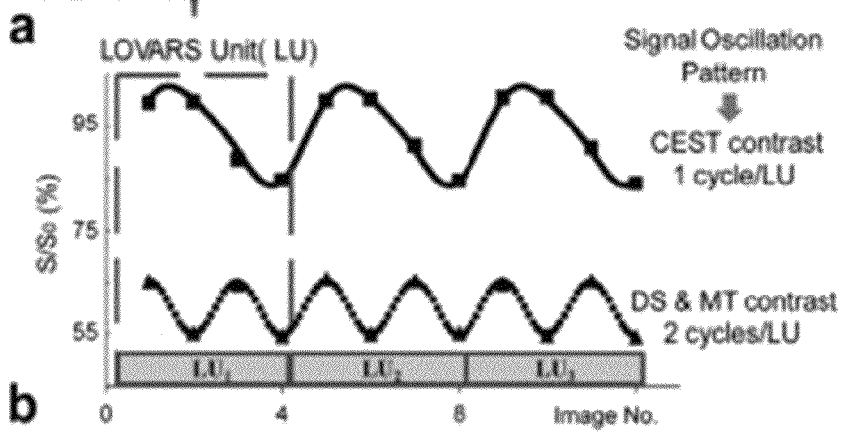
Figure 2C:
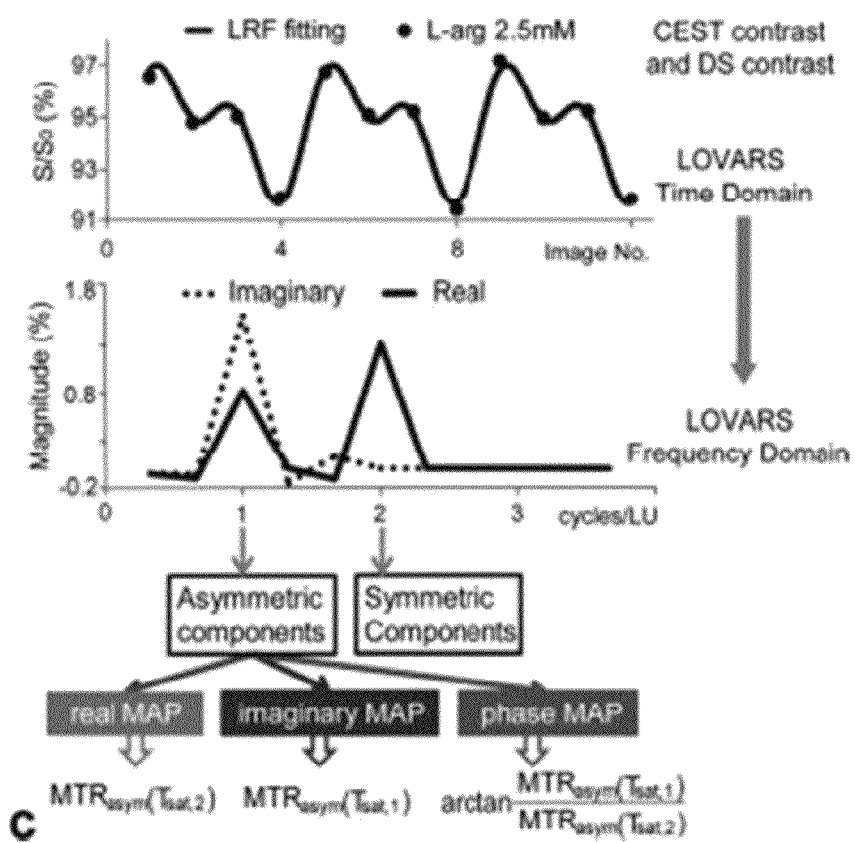

Based on the knowledge that CEST, DS and MTC behave differently as a function of $t_{sat}$ and using the symmetry properties of DS and MTC (predominantly symmetric) and CEST (asymmetric) around the water resonance, the LOVARS imaging scheme was designed, as illustrated in FIGS. 2A-2C. FIGS. 2A-2C illustrate the LOVARS acquisition scheme depicting the oscillation patterns produced in water signal. FIG. 2A illustrates the variation in saturation image LOVARS collection pattern, with both saturation offset (Δω), and length ($t_{sat}$) manipulated in a LOVARS Unit, with N total units collected, where N can equal any number, but in this example is 2 or 3. FIG. 2B illustrates the resulting signal patterns produced on either 5 mg/mL PLL (upper, solid squares) or 4% agar (lower, solid triangles) with the data fit using Eq. 6. CEST contrast oscillates at 1 cycle/LOVARS Unit and DS and MTC oscillate at 2 cycles/LOVARS Unit. FIG. 2C illustrates the LOVARS signal patterns for L-arginine (2.5 mM), Δω=1.8 ppm, containing both CEST and DS contrast, with the data fit using Eq. 6. The time domain data is transformed to the LOVARS frequency domain, generating the new LOVARS parameters for each voxel: real, imaginary and phase values. As noted above, while FIGS. 2A-2C illustrate LOVARS units this is not to be considered limiting and these aspect units could also take the form of any aspect units known to one of skill in the art such as LOVARS, L-VARS, NOVARS, N-VARS, MOVARS, M-LVARS, M-NVARS, M-PVARS, M-VARS, POVARS, and P-VARS etc.

For this scheme, a series of images is acquired using N LOVARS' Units with four images within each LOVARS unit, as illustrated in FIG. 2A:

$$[S_1, S_2, S_3, S_4] = [S(-\Delta\omega, T_{sat,2}), S(-\Delta\omega, T_{sat,1}),$$
$$S(+\Delta\omega, T_{sat,2}), S(+\Delta\omega, T_{sat,1})] \quad (5)$$

where $S(-\Delta\omega, T_{sat,2})$ represents the image signal with a saturation pulse with offset $-\Delta\omega$ and length $T_{sat,2}$. Two different offsets are used: (i) $+\Delta\omega$, on resonance with the exchangeable protons and (ii) $-\Delta\omega$, on the opposite side of water from the exchangeable protons, and two different $t_{sat}$ values, a longer one ($T_{sat,1}$) and a shorter one ($T_{sat,2}$). Assuming no $B_0$ inhomogeneity, as illustrated in FIG. 1, DS and MTC are mostly symmetric and therefore the signal loss for $+\Delta\omega$ and $-\Delta\omega$ are the same for a given $t_{sat}$ resulting in two oscillations/LOVARS unit as shown in FIG. 2B. In contrast, for CEST agents such as PLL, signal loss occurs when the saturation pulse is on resonance with the protons ($+\Delta\omega$) and not when the pulse is on the opposite side of water ($-\Delta\omega$), leading to only 1 oscillation/LOVARS unit, also illustrated in FIG. 2B.

Considering the combined contributions of CEST, DS, and MTC, the pattern of water signal can be represented by the LOVARS Response Function (LRF):

$$S_{irf} = A_0 + A_1 \times \cos[\pi/2(m-1)+\phi] + A_2 \times \cos[\pi(m-1)] \quad (6)$$

where "m" is the image number in the LOVARS time series (m=1,2, . . . , 4XN) after acquiring N LOVARS units, $\cos(\pi/2(m-1)+\phi)$ represents the asymmetric components of the contrast (Eq. 1) and $\cos(\pi(m-1))$ represents the symmetric components of the contrast, as illustrated in FIG. 1C, with respect to frequency offset. In addition, $A_0$ represents the mean water signal (DC bias), $A_1$, $A_2$ are amplitudes of the two cosine functions with different frequencies, and $\phi$ is the phase of the cosine modulation at the frequency of 1 cycle/LOVARS units. These parameters can be determined using either GLM or FFT. FIGS. 2B and 2C further show the LOVARS signal pattern for PLL and L-arginine respectively, with both fit to Eq. 6. The pattern for PLL is predominantly due to CEST contrast. For L-arginine the pattern contains both CEST and DS effects due to the closeness of the exchangeable protons chemical shift to water (1.8 ppm).

The LOVARS scheme creates modulations in the water signal that can be analyzed in multiple ways. One possibility is to FFT the signal intensity in the LOVARS time series to determine the contributions of CEST contrast, as illustrated in FIG. 2B. According to the Discrete Fourier Transform of the acquisition pattern in Eq. 5 (normalized by $S_0$), for the nth LOVARS units (n=1,2, . . . , N) the transformed signal in LOVARS frequency domain is:

$$L(k) = \frac{1}{S_0} \sum_{i=1}^{4} S_{l,n} \times e^{(-\frac{2\pi i}{4} \times (l-1)^k)} \quad (7)$$

where k is in units of cycles/LOVARS units and l is the image index within one LOVARS units. For k=1 cycle/LOVARS units, expanding Eq. 7 using $$e^{(-\frac{2\pi i}{4} \times (l-1)^k)} = \cos\left(-\frac{2\pi i}{4} \times (l-1)^k\right) + \sin-\frac{2\pi i}{4} \times (l-1)$$

gives:

$$L(1 \text{ cycle}/LOVARS \text{ units}) = \frac{1}{S_0}(S_{1,n} - S_{3,n}) - i(S_{2,n} - S_{4,n}) \quad (8)$$

$$= \frac{1}{S_0}[S(-\Delta\omega, T_{sat,2}) - S(+\Delta\omega, T_{sat,2})] -$$

$$i[S(-\Delta\omega, T_{sat,1}) - S(+\Delta\omega, T_{sat,1})]$$

$$= MTR_{asym}(T_{sat,2}) - iMTR_{asym}(T_{sat,1})$$

L(1 cycle/LOVARS units) relates in a straightforward manner to $MTR_{asym}$. The imaginary part of L(1 cycle/LOVARS units) corresponds to the $MTR_{asym}$ produced using the longer saturation pulse, $MTR_{asym}(T_{sat,1})$, while the real part corresponds to the $MTR_{asym}$ using a shorter saturation pulse, $MTR_{asym}(T_{sat,2})$. The relative phase between these two amplitudes ($\phi$) is determined by $\tan(\phi) = MTR_{asym}(T_{sat,1})/MTR_{asym}(T_{sat,2})$. When the two saturation lengths are chosen such that for CEST contrast: $PTR(T_{sat,1}) > PTR(T_{sat,2})$, while for MTC or DS: $MTR_{asym}^{field}(T_{sat,1}) \leq MTR_{asym}^{field}(T_{sat,2})$, the phase can be considered a new CEST contrast parameter that accounts for differences in the $t_{sat}$-dependence between PTR, $MTR_{asym}^{inherent}$ and $MTR_{asym}^{field}$ (Eq. 2). Alternatively, GLM (commonly applied in fMRI) can be used to process the images using Eq. 6 as a model.

To estimate the optimal saturation parameters for LOVARS, simulations were performed on two different CEST contrast agents: PLL and L-arginine, using the numerical solutions for 2-pool and 3-pool models, respectively. It should, however, be noted that any endogenous or exogenous CEST, paraCEST or MT contrast agent known to one of skill in the art can be used. The PLL simulations were performed as described previously. The L-arginine simulations were performed using two solute pools "a," chemical shift difference=1.1 ppm (amine), and "b," chemical shift difference=2 ppm (guanidyl amine) and a water pool "w." The Bloch equations were written in the general form $dY/dt = A*Y+b$ and solved using MATLAB (The MathWorks, Natick, Mass.). Based on fitting the three pools in L-arginine at 11.7 T, the relaxation rates are: $R_{1w}=0.3$ s$^{-1}$, $R_{1a}=R_{1b}=0.71$ s$^{-1}$, $R_{2w}=1$ s$^{-1}$, $R_{2a}=32$ s$^{-1}$, and $R_{2b}=50$ s$^{-1}$, and the exchange rates are $k_{aw}=150$ s$^{-1}$, $k_{bw}=800$ s$^{-1}$, and $k_{ab}=100$ s$^{-1}$ with the saturation $B_1=3.8$ μT. For 10 mM L-arginine the relative molar concentration of exchangeable protons to water protons ($[H^{exch}]_{solute}/[H]_{H2O}$) is $0.27 \times 10^{-3}$ for pool "a" and $0.36 \times 10^{-3}$ for pool "b." For the simulations including noise, 1, 2, and 3% gaussian white noise with mean of zero was added to the L-arginine simulations using MATLAB function "randn." While MATLAB was used in the examples discussed herein any other mathematic computation software program known to one of skill in the art can be used.

Additionally simulations were carried out to model the dependence of MTC. Data acquired on agar was simulated, a model of tissue magnetization transfer, by numerically solving the Bloch equations using a 2-pool model. The Z-spectra were first simulated at several different concentrations (2, 3, and 4%) of agar using the relaxation and exchange rates: $R_{1s}=1$ s$^{-1}$, $R_{2s}=2.23 \times 10^5$ s$^{-1}$, $R_{1w}=0.35$ s$^{-1}$, $R_{2w}=1.3$ s$^{-1}$, and $k_{sw}=176$ s$^{-1}$. To determine the $t_{sat}$ dependence of $MTR_{asymn}^{inherent}$ and $MTR_{asym}^{field}$, the offset of the saturation pulse was shifted and the difference in water signal resulting from the saturation pulse (e.g., if the water frequency is shifted by 0.1 ppm, then the original offsets $+\Delta\omega$ and $-\Delta\omega$ would shift to $+\Delta\omega$ 0.1 ppm and $-\Delta\omega$ −0.1 ppm, respectively) as a function of $t_{sat}$ was calculated.

A phantom was prepared that includes four types of samples: a CEST contrast agent (L-arginine), two MTC molecular models (cross-linked bovine serum albumin(BSA) and agar) and 0.01 M phosphate-buffered saline (PBS), pH=7.4, which should only show DS. All samples were dissolved in PBS and placed into 1 mm capillary tubes. L-arginine (Sigma, St Louis, Mo.) samples were prepared at four concentrations (10 mM, 5 mM, 2.5 mM, and 1.25 mM) to produce a range of CEST contrast. Crosslinked BSA samples (2.5 and 5%) were prepared using bovine serum albumin (Sigma, St Louis, Mo.) by heating this for 8 min in a water bath at 80° C. Agar samples were prepared at concentrations of 2, 3, and 4% w/v.

Rat gliosarcoma cells (9L) were grown in standard medium, collected by trypsinization, washed, and suspended in medium at a concentration of $1 \times 10^5$ cells/μL. Balb/c NOD/SCID male mice (6-8 weeks old; n=7, ~25 g weight) were initially anesthetized in a chamber containing 4-5% isoflurane. The animals were positioned in a stereotactic device (Stoelting Lab Standard), a small midline skin incision was made to expose the skull, and a 1 mm$^2$ hole was drilled 2 mm to the right of the bregma. Cells ($2 \times 10^5$/2 μL) were injected into the striatum, 2.5 mm ventral to the surface of the brain, slowly over a period of 3 min with the syringe removed 30 s after completion to minimize back flow.

For MRI, mice were anesthetized using 0.5-2% isoflurane. Immediately following the last MRI, mice were perfused with PBS followed by 4% paraformaldehyde(PFA), brains were removed, preserved in 4% PFA at 4° C. for a week, cryosectioned (25 μm thick), and stained using hematoxylin and eosin (H&E).

All experiments were performed on an 11.7 T vertical bore Bruker Avance system (Bruker Biospin, Billerica, Mass.) with a 15 mm birdcage radiofrequency coil. However, any suitable system known to one of ordinary skill in the art can be used. The imaging sequence consists of a continuous-wave (CW) saturation pulse and a rapid acquisition with relaxation enhancement (RARE) sequence (RARE factor=8). Other imaging parameters were: field of view (FOV)=1.15×1.15 cm, acquisition matrix size=64×64, slice thickness=0.5 mm. The scanning protocol is similar to that described previously. At the beginning of the session, a group of images were acquired with Δω incremented from −0.6 ppm to 0.6 ppm (0.1 ppm step), $t_{sat}$=500 ms, $B_1$=0.5 μT, and repetition time (TR)/echo time (TE)=2200 ms/4.9 ms to generate the $B_0$ map using water saturation shift referencing (WASSR). Then a second set of saturation images was collected with Δω from −5 to 5 ppm (0.3 ppm step), $t_{sat}$=4.0 s, $B_1$=3.8 μT, TR/TE=6000 ms/4.9 ms, and number of averages (NA) equals 1 to generate the Z-spectrum. Another three pairs of saturation images (NA=2), with saturation offsets of ±1.55 ppm, ±1.8 ppm, and ±2.05 ppm for L-arginine are collected for the contrast map using OIC. For optimizing LOVARS, images were first acquired with $t_{sat}$ varied from 0.5 to 5 s. The final LOVARS images used two LOVARS units, Δω=+1.8 ppm or −1.8 ppm, $T_{sat,2}$=1.5 s, and $T_{sat,1}$=4 s. An image without saturation pulse ($S_0$) was collected as intensity reference.

All experiments were performed on a 9.4 T horizontal bore animal Bruker Avance system with a 25 mm sawtooth coil. However, as noted above, any suitable device known to one of skill in the art can be used. After acquiring $T_2$-weighted scout images, a 1 mm thick coronal slice at the center of the tumor was chosen for collection of both OIC and LOVARS images. The pulse sequences were kept similar to the phantom studies with the following modifications. First, WASSR $B_0$ map images were collected with Δω incremented from −0.5 ppm to 0.5 ppm (0.1 ppm step), $t_{sat}$=500 ms, $B_1$=0.5 μT, TR/$TE_{effective}$=1500 ms/14.6 and NA=2, which was used for Scheme 2 OIC maps. After this, a Z-spectrum with Ow incremented from −4 ppm to +4 ppm (0.25 ppm step or use the scheme in Table 2, reproduced below, was collected using $t_{sat}$=3000 ms, $B_1$=3 μT, TR/TE=5000 ms/14.6 ms, NA=1. Another 3 pairs of the saturation images (NA=2) were collected with offsets at ±3.25 ppm, ±3.5 ppm and ±3.75 ppm, respectively to generate the $MTR_{asym}$ map using Scheme 1 for OIC as described previously (14,36). For optimizing LOVARS, images were acquired with $t_{sat}$ varied from 0.8 to 4 s. The final LOVARS images used 2 LOVARS Units, Δω=+3.5 ppm or −3.5 ppm, $T_{sat,2}$=0.8 s, and $T_{sat,1}$=3 s. An image without saturation pulse ($S_0$) was collected as a reference. The remaining imaging parameters were matrix size=128×64, FOV=1.65×1.5 cm.

For 3 mice, for tumor identification, additional $T_1$-weighted ($T_1$-w) Gd-DTPA images were collected after tail vein injection of 0.4 mmol/kg mouse body weight Gd-DTPA (Magnevist®). $T_1$-w images with the same FOV and resolution were acquired prior to injection and every 30 s until 15 mins after injection. The imaging parameters were: TR/TE=1000 ms/7 ms, RARE factor=2, and NA=1. All processing was performed using custom-written scripts in Matlab as described herein. All simulations and phantom experiments were performed at 11.7T. However, any experimental protocol within the capability of one of ordinary skill in the art can be used.

Figure 3A:
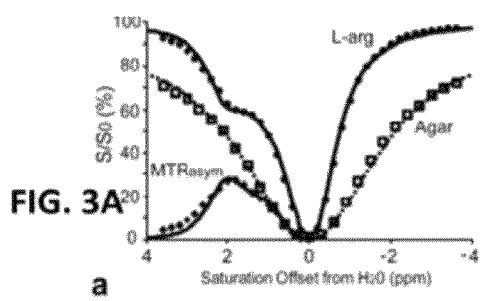
FIGS. 3A-3F illustrate a comparison between 10 mM L-arginine and 2% agar phantoms at 11.7T using both experiments (symbols) and simulations (lines).
Figure 3B:
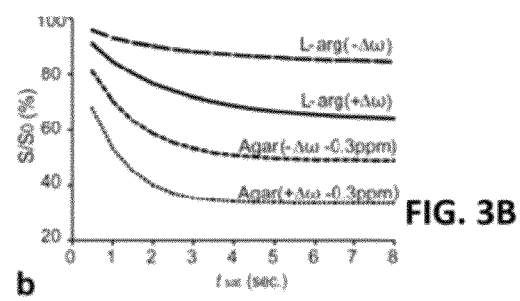
Figure 3C:
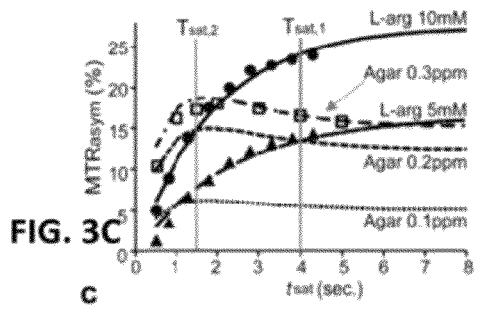
Figure 3D:
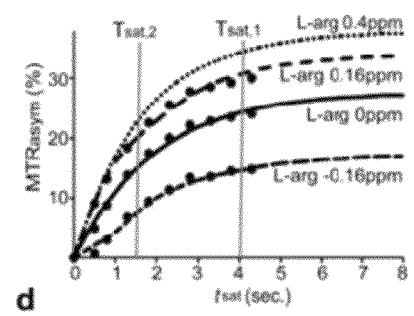
Figure 3E:
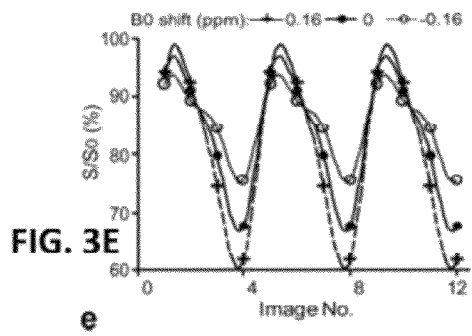
Figure 3F:
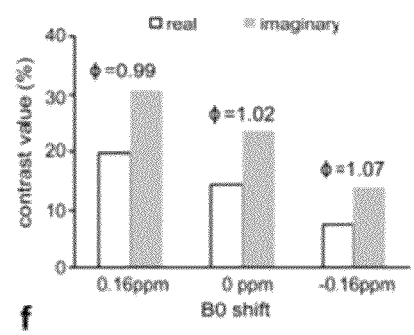

To design the LOVARS scheme, illustrated in FIGS. 2A-2C, experimental data was collected from a phantom consisting of 1 mm capillaries containing L-arginine (CEST agent) or agar (MTC agent). FIGS. 3A-3F illustrate a comparison between 10 mM L-arginine and 2% agar phantoms at 11.7 T using both experiments (symbols) and simulations (lines). FIG. 3A illustrates an experimental Z-spectra (agar and L-arginine) and $MTR_{asym}$ (L-arginine only) curves (symbols) and fitted (line). FIG. 3B illustrates simulations of water signal changes as function of $t_{sat}$ for saturation offsets of +Δω or −Δω for 10 mM L-arginine. For 2% agar the signal was plotted with saturation at +Δω −0.3 ppm and −Δω −0.3 ppm due to a water frequency shift of 0.3 ppm. FIG. 3C illustrates $t_{sat}$-dependence of $MTR_{asym}$ for L-arginine (10 mM and 5 mM, saturation at ±Δω) and for 2% agar with the water frequency shifted by 0.1, 0.2, and 0.3 ppm. FIG. 3D illustrates $MTR_{asym}$ as a function of $t_{sat}$ for L-arginine (10 mM) with the water frequency shifted by −0.16, 0, 0.16, and 0.4 ppm. FIG. 3E illustrates LOVARS oscillation patterns and LRF fit for $B_0$ shifts of −0.16, 0, and 0.16 ppm, and FIG. 3F illustrates FFT transform of patterns in FIG. 3E, showing real and imaginary components (and phase on top).

The simulated Z-spectra and $MTR_{asym}$ (for L-arginine) curves were fit to the experimental data, as illustrated in FIG. 3A. Additional simulations were performed to model the $t_{sat}$-dependence of the CEST and MTC agents. The simulations illustrated in FIG. 3B, demonstrate that for L-arginine the difference between the water signals $S(+\Delta\omega)/S_0$ and $S(-\Delta\omega)/S_0$ continue to increase with increasing $t_{sat}$. In contrast, for agar with a $B_0$ shift=0.3 ppm, after $t_{sat}$ exceeds 1.5-2 s, the separation between $S(+\Delta\omega-0.3$ ppm$)/S_0$ and $S(-\Delta\omega-0.3$ ppm$)/S_0$ no longer increases. If there is no $B_0$ inhomogeneity, the overall $MTR_{asym}$=0 for agar, with $B_0$ inhomogeneity $MTR_{asym}^{field}$ is nonzero in Eq. 2, leading to the overall $MTR_{asym} \neq 0$. To determine the optimal $T_{sat,1}$ and $T_{sat,2}$ for LOVARS, the $MTR_{asym}$ was plotted as a function of $t_{sat}$. After 1.5 s, the $t_{sat}$-dependence curves for agar plateau regardless of the shift in $B_0$, as illustrated in FIG. 3C. However, as shown for two different concentrations of L-arginine, the $MTR_{asym}$ continues to increase. Therefore, 1.5 s was selected as $T_{sat,2}$. At $T_{sat}$=4 s, the $MTR_{asym}$ curves almost reach a maximum for L-arginine and therefore 4 s was chosen as $T_{sat,1}$. For L-arginine (10 mM) with $B_0$ shifts 0.4 ppm, 0.16 ppm, 0 ppm, and −0.16 ppm, the curves maintain the feature of $MTR_{asym}$ ($T_{sat,1}$)>$MTR_{asym}$($T_{sat,2}$), as illustrated in FIG. 3D. If the LOVARS oscillation patterns are plotted and fit to Eq. 6, as illustrated in FIG.3E, the phase varies <5%, as illustrated in FIG. 3F, while the uncorrected $MTR_{asym}$ (Imaginary component) varies 30% (+0.16 ppm) or 41.7% (−0.16 ppm).

FIGS. 4A-4L illustrate in vitro test of the performance of the LOVARS phase mapping scheme. FIG. 4A illustrates a configuration of the phantom (R1-R4: Arginine 10 mM, 5 mM, 2.5 mM, and 1.25 mM at pH=7.4, A1-A3: Agar 2, 3, and 4%, B2: 2.5% heat crosslinked BSA, B5: 5% heat crosslinked BSA, P: 10 mM PBS; FIG. 4B illustrates the $B_0$ shift map obtained using WASSR; FIG. 4C illustrates an uncorrected $MTR_{asym}$ map, $\Delta\omega=\pm 1.8$ ppm, $t_{sat}=1.5$ s, which corresponds to a LOVARS real component map; FIG. 4D illustrates an uncorrected $MTR_{asym}$ map, $\Delta\omega=\pm 1.8$ ppm, $t_{sat}=4$ s, which corresponds to a LOVARS imaginary component map; The highest concentrations of L-arginine are marked by the solid white arrows, which clearly show that the CEST contrast (PTR) increases from $t_{sat}=1.5$ to 4 s. MTC tubes also highlight when the $B_0$ shift are larger than 100 Hz, however this contrast, $MTR_{asym}^{field}$, is either the same or smaller as $t_{sat}$ increases from 1.5 to 4 s.(open white arrows); FIG. 4E illustrates an OIC $MTR_{asym}$ map, $\Delta\omega=\pm 1.8$ ppm, $t_{sat}=4$s; FIG. 4F illustrates a LOVARS phase map; FIG. 4G illustrates a LOVARS phase map using the thresholds described in Supporting Information; FIG. 4H illustrates a LOVARS imaginary component map using the thresholds described in Supporting Information; FIG. 4I illustrates a plot of the water signal pattern produced for 8 LOVARS images (2 LOVARS Units) in the 10 mM L-arginine tube, and FIG. 4J illustrates real and imaginary components after FFT for 10 mM L-arginine, with imaginary (1 cycle/LOVARS Unit)>real (1 cycle/LOVARS Unit); FIG. 4K illustrates a plot of the water signal pattern produced for 8 LOVARS images (2 LOVARS Units) in a 2% agar tube with $B_0$ shift=0.3-0.4 ppm, and FIG. 4L illustrates the corresponding real and imaginary components after FFT, with imaginary (1 cycle/LOVARS Unit)=real (1 cycle/LOVARS Unit).

Further with respect to FIGS. 4A-4L, FIG. 4A illustrates the distribution of samples in the phantom designed to test the capabilities of LOVARS, including four concentrations of L-arginine, three concentrations of agar, two concentrations of crosslinked BSA, and PBS. FIG. 4B displays the WASSR $B_0$ map, with the $B_0$ shift varying from 0 to 0.5 ppm. FIGS. 4C and 4D display the $MTR_{asym}$ maps at $\pm 1.8$ ppm for $t_{sat}=1.5$ and 4 s, respectively. L-arginine tubes are highlighted through CEST contrast (PTR) that increases from $t_{sat}=1.5$ to 4 s. MTC tubes also display contrast when their $B_0$ shift >0.2 ppm, however this contrast ($MTR_{asym}^{field}$) is either the same or smaller as $t_{sat}$ increases. The OIC $MTR_{asym}$ map is displayed in FIG. 4E, with the high-concentration L-arginine tubes highlighted. It is difficult to detect tubes containing lower concentrations of L-arginine or to discriminate these from agar or BSA. FIGS. 4I and 4K display how the pattern of water signal can be manipulated with the LOVARS scheme for tubes containing L-arginine and agar when 2 LOVARS Units are collected.

The signal patterns can be Fourier-transformed or fit to Eq. 6 (GLM), with the FFT results shown in FIGS. 4J and 4L. After FFT, the magnitude of the real and imaginary components at 1 cycle/LOVARS Unit is nearly the same in the agar tubes, as illustrated in FIG. 4L, whereas the imaginary component dominates in L-arginine tubes, as illustrated in FIG. 4J, indicating that the LOVARS phase ($\phi$ in Eq. 6) can be used to detect the presence of CEST contrast (PTR). Here, the phase range was constrained to $-\pi<\phi<\pi$. The experimental LOVARS phase map is shown in FIG. 4F. The phase for all but one of the BSA, agar and PBS tubes $\leq 3\pi/10$, even with a $B_0$ inhomogeneity offset of up to 0.5 ppm, while the phase for the L-arginine tubes is $>3\pi/10$. For one PBS tube (3rd row, 2nd column), the phase varies widely due to $MTR_{asym}$ almost equaling 0 and the noise dominates.

To avoid this, the phase range of $[3\pi/4, \pi]$ was unwrapped to $[-5\pi/4, -\pi]$. FIG. 4G shows only CEST tubes possess a phase within $\pi/2>\phi>3\pi/10$, eliminating all the MTC and PBS tubes regardless of the $B_0$ inhomogeneity. In addition, the LOVARS contrast maps, as illustrated in FIGS. 4F-4H, appear less noisy than the OIC-based $MTR_{asym}$ map, illustrated in FIG. 4E. For quantitative comparison, Table 1 shows the number of scans, the total scan time, and the CNR for both LOVARS and OIC methods. The "CNR efficiency," which equals the CNR divided by square root of the scan time, is used to evaluate the performance of the 2 methods. From the table it can be seen that LOVARS phase has about 2 times the CNR efficiency of the OIC method.

TABLE 1

Experimental Comparison Between LOVARS and OIC: $_L$-Arginine 10 mM

|   |   | No. of Scans | Scan time (s) | CNR[a] Phase | Imaginary | CNR Efficiency $(s^{-1/2})$[b] Phase | Imaginary |
|---|---|---|---|---|---|---|---|
| LOVARS | 1 LOVARS Unit (4 scans) + 1 $S_0$ | | 480 | 28.5 | 23.1 | 1.3 | 1.1 |
| | 2 LOVARS Units (8 scans) + 1 $S_0$ | | 864 | 38.1 | 35.7 | 1.3 | 1.2 |
| | 3 LOVARS Units (4 scans) + 1 $S_0$ | | 1248 | 56.9 | 42.9 | 1.6 | 1.2 |
| | | | | $MTR_{asym}$ | | $MTR_{asym}$ | |
| OIC | B0 field map (WASSR) | | 221 | 21.4 | | 0.71 | |
| | 6 scans + 1 $S_0$ | | 672 | | | | |
| | Total | | 893 | | | | |

Figure 5A:
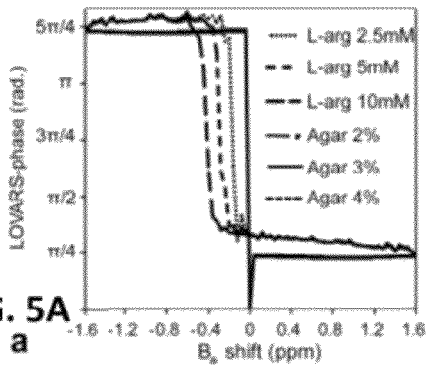
FIGS. 5A-5F illustrate a series of simulations performed to test the limits of LOVARS phase mapping scheme in the presence of $B_0$ shifts and noise.
Figure 5B:
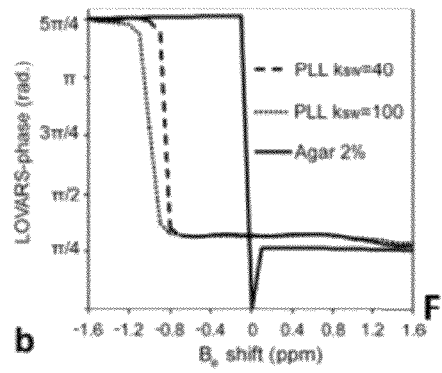
Figure 5C:
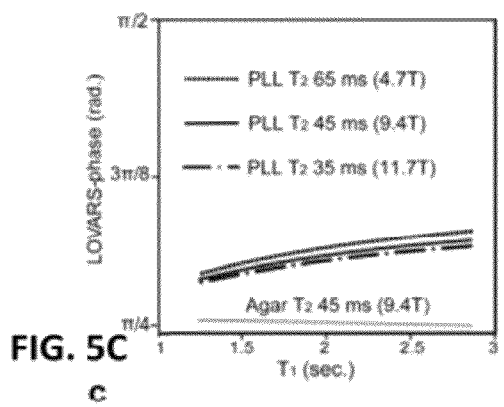
Figure 5D:
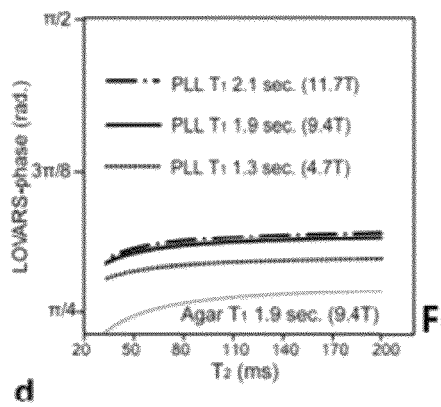
Figure 5E:
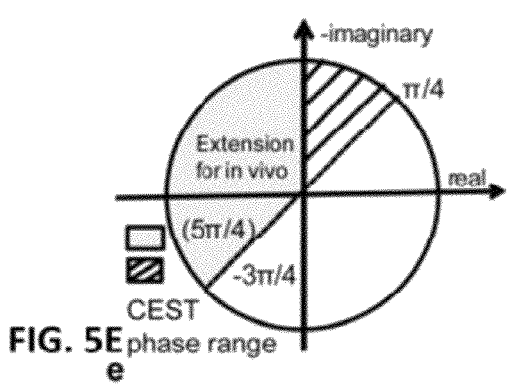
Figure 5F:
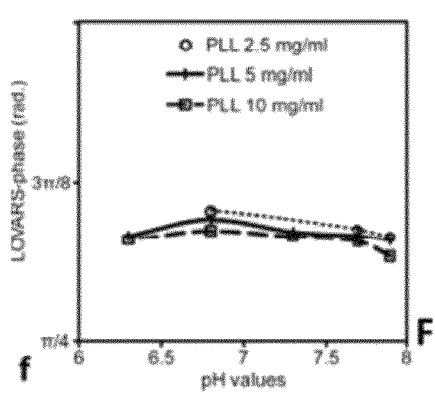

[a] $CNR_{contrast}$ for a specific contrast is calculated by $\sqrt{2}\, \dfrac{mean(S_{contrast})}{std(S_{contrast,1} - S_{contrast,2})}$, where $S_{contrast,1}$ and $S_{contrast,2}$ are the signal intensity of two contrast maps acquired consecutively.
[b] $CNRefficiency_{contrast} = CNR_{contrast}/\sqrt{scantime}$ Further, a series of simulations was performed to test the limits of LOVARS phase mapping scheme in the presence of $B_0$ shifts and noise, as illustrated in FIGS. 5A-5F. FIG. 5A illustrates simulations of LOVARS phase as a function of $B_0$ shift for L-arginine (10 mM, 5 mM, 2.5 mM) and agar (1, 2, 4%), $\Delta\omega=\pm 1.8$ ppm, with the resulting phase for all agar samples nearly identical. FIG. 5B illustrates simulation of LOVARS phase as a function of $B_0$ shift for PLL ($k_{sw}=40$, 100) and 2% agar, $\Delta\omega=\pm 3.6$ ppm; FIG. 5C illustrates simulation of LOVARS phase as a function of water $T_1$ for PLL ($k_{sw}$=40) and 2% Agar, with $T_2$ set to the average rodent brain value found at 4.7T, 9.4T, and 11.7T. FIG. 5D illustrates simulation of LOVARS phase as a function of $T_2$ relaxation for PLL ($k_{sw}$=40) and Agar 2%, with $T_1$ set to the average rodent brain value found at 4.7, 9.4, and 11.7T. FIG. 5E illustrates phase range restrictions suitable for determining which pixels display CEST contrast; FIG. 5F illustrates LOVARS phase as a function of pH for three different concentrations of PLL(10 mg/mL, 5 mg/mL, and 2.5 mg/mL). The exchange rates varied from ~70 Hz (pH 6.4) to ~1200 Hz (pH 7.9) for these samples.

Two different CEST agents were used: L-arginine and PLL, which possess exchangeable protons at 1.8 ppm and 3.6 ppm separated from water, and compared with the phase value produced by the MTC agent agar. FIG. 5A illustrates how the phase changes for three different concentrations of L-arginine and agar. The phase varies slightly with concentration and $B_0$ shift for L-arginine, and provided the $B_0$ shift is between −0.2 and +1.2 ppm, this phase can be used to discriminate L-arginine from agar using the criteria $\pi/2 > \phi > 3\pi/10$. For shifts ranging from −0.2 to −1.2 ppm, L-arginine can be discriminated using the criterion $\phi > 5\pi/4$. Next, it was determined how this scheme would perform for PLL, which has exchangeable protons twice the resonance frequency of L-arginine, as illustrated in FIGS. 1A and 1B, with the center at 3.6 ppm.

FIG. 5B shows how the LOVARS phase varies for PLL and agar using the LOVARS scheme when the saturation pulse is set at 3.6 ppm, where the LOVARS phase criterium $\pi/2 > \phi > \pi/4$ can be used to discriminate PLL from agar for a wide range of $B_0$ shifts (−0.8 to +1ppm). FIGS. 5C and 5D display how the phase depends on the water relaxation times, with the variation shown covering most brain tissues at field strengths of 4.7T, 9.4T and 11.7T. The criteria of LOVARS phase mapping are shown schematically in FIG. 5E, owing to the feature of $PTR(T_{sat,1}) > PTR(T_{sat,2}) > 0$ for phantoms and extending to $PTR(T_{sat,1}) > PTR(T_{sat,2})$ for in vivo imaging. How the phase changes as a function of concentration and exchange rate through titrating three different concentrations of PLL (10 mg/mL, 5 mg/mL, and 2.5 mg/mL) from pH 6.4 to 7.9, was also investigated, as illustrated in FIG. 5F.

Figure 6C:
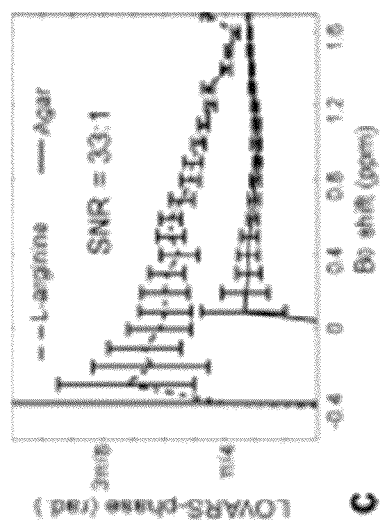
FIGS. 6A-6C illustrate simulations performed at 1 1.7T using 2.5 mM L-arginine and 2% agar, to determine how LOVARS performs as the SNR of the images change.
Figure 6B:
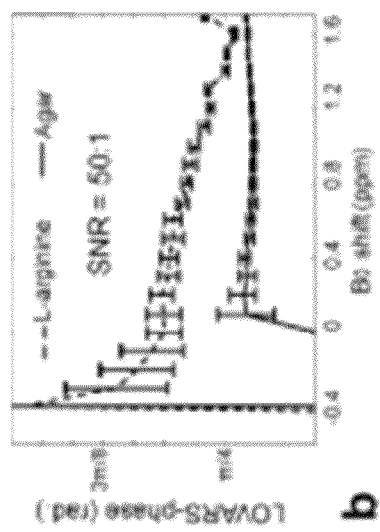
Figure 6A:
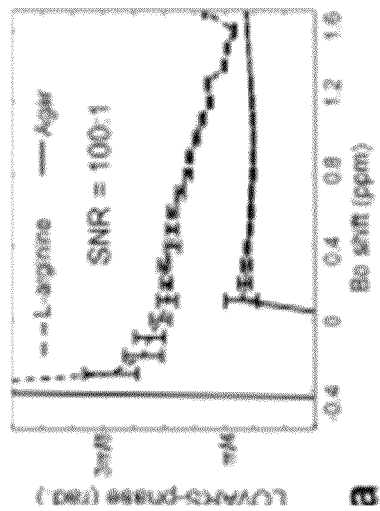

To determine how LOVARS performs as the SNR of the images change, simulations were performed at 11.7T using 2.5 mM L-arginine and 2% agar, as illustrated in FIGS. 6A-6C. Reduced SNR introduced an uncertainty in the measurement of the phase. However even with 3% noise, as illustrated in FIG. 6C, there is a clear separation between L-arginine and agar for $B_0$ shifts varying up to 1.2 ppm, with a trend very similar for PBS. The phase for agar has a maximum of $\sim 3\pi/10$.

To test the performance of the scheme in vivo, LOVARS images were acquired on mice bearing 9L gliosarcomas, which are expected to show amide proton transfer contrast at an offset of 3.5 ppm. Similar to the phantom experiments, $T_{sat,1}$ and $T_{sat,2}$ were chosen based on examination of the $t_{sat}$-dependence of $MTR_{asym}$ in tumor and contralateral control tissue. The average $MTR_{asym}$ in tumors plateaued at a $t_{sat}$=3 s which was used for $T_{sat,2}$, $T_{sat,2}$ was set to 0.8 s to satisfy $MTR_{asym}(T_{sat,2}) \sim 0.5 \times MTR_{asym}(T_{sat,1})$.

FIGS. 7A-7G illustrate in vivo demonstration of the LOVARS scheme as applied to the imaging of 9L gliosarcomas in mice. FIG. 7A illustrates T2-w scout image; FIG. 7B illustrates a $B_0$ shift map (WASSR); FIG. 7C illustrates an uncorrected $MTR_{asym}$ map; FIG. 7D illustrates a LOVARS time domain data (top) with phase (middle) and magnitude (bottom) traces determined through FFT with ROIs as marked in (c), ROI1=tumor region and ROI2=control tissue with large $B_0$ shift. The arrows point to the average phase (bottom) and magnitude (middle) in ROI1 and ROI2 at 1cycle/LOVARS Unit based on FFT; FIG. 7E illustrates a LOVARS phase map calculated using FFT; FIG. 7F illustrates a LOVARS phase map calculated using GLM; FIG. 7G illustrates a thresholded LOVARS imaginary component map.

Further, FIGS. 7A-7G illustrate images of a mouse 8 days after tumor inoculation. The WASSR map, illustrated in FIG. 7B shows a typical range in $B_0$ shift from −0.4 ppm to 0.2 ppm across voxels in the brain slice, which distorts the $MTR_{asym}$ map, shown in FIG. 7C, generated using only two images with $\Delta\omega$=+3.5 ppm and −3.5 ppm. The artifacts are especially prominent in the lower right hemisphere where there is normal brain tissue but water is shifted +0.2 ppm. However, when 2 LOVARS Units are acquired (8 scans) and the signal is followed for ROIs enclosing either the tumor (ROI1) or poorly shimmed control brain tissue (ROI2), as was the case for the phantoms, the LOVARS phases show a large difference between the two ROIs, shown in FIG. 7D despite the fact that the $MTR_{asym}$ (magnitude) is very similar in the uncorrected CEST map shown in FIG. 7C. The LOVARS phase images produced using either FFT or GLM are shown in FIG. 7E and 7F respectively. Alternatively, the pixels can be excluded with $\pi/4 > \phi > -3\pi/4$ to threshold the imaginary component map (uncorrected $MTR_{asym}(T_{sat,1})$ map as in FIG. 7C, displays the same information as the $MTR_{asym}$ map obtained by OIC, but with all 8 images contributing to the CNR of the contrast map.

FIGS. 8A-8D illustrate four representative LOVARS phase and imaginary component maps acquired 5, 7, and 11 days after tumor engraftment compared with other methods. FIGS. 8A and 8B illustrate: Top: LOVARS phase maps; middle: LOVARS imaginary component maps; bottom: OIC $MTR_{asym}$ map obtained using 6 offsets; FIGS. 8C and 8D illustrate: Top: LOVARS phase maps; Middle: LOVARS imaginary component maps; Bottom of FIG. 8C: $T_1$-w image collected 30 s after administration of Gd-DTPA; Bottom of FIG. 8D: H&E stain after tissue sectioning.

Next, the variation was examined in the LOVARS phase maps from day 5 to day 11 after cell engraftment. Tumors could clearly be detected in these LOVARS phase, as illustrated in the top pictures of FIGS. 8A-8D and filtered imaginary maps, as illustrated in the middle pictures of FIGS. 8A-8D, which compared favorably to those collected using OIC, as illustrate in the bottom pictures of FIGS. 8A-8B and after administration of Gd-DTPA, as illustrated in the bottom picture of FIG. 8C, as validated with H&E staining, as illustrated in the bottom FIG. 8D.

As shown in Table 2, reproduced below, LOVARS phase provides dramatic contrast for tumors (average $\phi$=1.12 radians or $\sim \pi/3$) over normal brain tissue (average $\phi$=−2.47 radians or $\sim -4\pi/5$), with a P-value of less than 0.001. The LOVARS contrast maps possess a higher CNR than the OIC maps, with the average CNR for the phase maps ~26.7 (2 LOVARS Units) vs. ~8.8 for OIC over the total 11 images on 7 mice and multiple days. Table 2 also lists the scan times for LOVARS and the two OIC methods, showing that LOVARS achieves ~3.2 times CNR efficiency of that for OIC Scheme 2.

TABLE 2

In Vivo Comparison of LOVARS and OIC
for 9L Tumors and Control Tissue

| | LOVARS | | OIC | |
|---|---|---|---|---|
| | Phase (tumor) | Phase (control) | $MTR_{asym}$ (tumor, %) | $MTR_{asym}$ (control, %) |
| Day 5/M2 | 1.2 ± 0.17 | −2.34 ± 0.13 | 3.6 ± 0.8 | −3.0 ± 0.6 |
| Day 5/M3 | 1.30 ± 0.20 | −2.6 ± 0.16 | 2.8 ± 1.0 | −3.9 ± 1.0 |
| Day 7/M2 | 1.12 ± 0.14 | −2.01 ± 0.14 | 4.8 ± 0.9 | −2.4 ± 0.8 |
| Day 8/M1 | 1.01 ± 0.17 | −2.71 ± 0.11 | 3.0 ± 0.4 | −1.0 ± 0.4 |

TABLE 2-continued

In Vivo Comparison of LOVARS and OIC
for 9L Tumors and Control Tissue

| | | | | |
|---|---|---|---|---|
| Day 8/M3 | 1.10 ± 0.29 | −2.23 ± 0.09 | 1.3 ± 0.7 | −4.4 ± 0.5 |
| Day 10/M7 | 1.08 ± 0.22 | −2.65 ± 0.13 | 4.8 ± 1.0 | −2.0 ± 0.8 |
| Day 10/M1 | 0.97 ± 0.20 | −2.65 ± 0.13 | 2.5 ± 0.7 | −2.7 ± 0.6 |
| Day 11/M2 | 1.08 ± 0.13 | −2.59 ± 0.14 | 5.2 ± 0.6 | −1.4 ± 0.7 |
| Day 11/M4 | 1.06 ± 0.12 | −2.48 ± 0.14 | 6.4 ± 0.9 | −2.7 ± 0.9 |
| Day 11/M5 | 1.20 ± 0.25 | −2.23 ± 0.15 | 2.1 ± 0.8 | −4.5 ± 0.9 |
| Day 11M6 | 1.16 ± 0.14 | −2.68 ± 0.16 | 3.8 ± 0.7 | −1.3 ± 0.9 |
| Average value | 1.12 | −2.47 | 3.7 | −2.7 |
| Average $CNR^a$ | 26.7 | | 8.8 | |

| | 2LOVARS Units | Scheme 1[b] | Scheme 2 |
|---|---|---|---|
| | 9 scans × 80 s/scan | Z spectrum<br>25 scans × 40 s/scan<br>APT map<br>7 scans × 80 s/scan | WASSR<br>11 scans × 24 s/scan<br>APT map<br>7 scans × 80 s/scan |
| | 12 min | 26 min (total) | 13.7 min (total) |
| CNR efficiency $(s^{-1/2})^c$ | 1.0 | 0.22 | 0.31 |

[a] $CNR = \sqrt{2}(S^{tumor} - S^{control})/\delta$, where the noise $\delta$ is the standard deviation of a 4 pixel by 4 pixel control ROI in the subtraction of two consecutively acquired contrast maps.
[b] The offsets for the Z-spectrum were chosen for optimized results.
[c] CNR efficiency equals to $CNR_{contrast}/\sqrt{T_{scan}}$ A new imaging scheme was constructed with the purposes of allowing the use of time domain analysis techniques to correct for $B_0$ inhomogeneity and achieve a higher CNR. Another time domain analysis technique for CEST has been proposed recently. The LOVARS scheme illustrated in FIG. 2 takes advantage of the simulations performed previously using $t_{sat}$ to quantify exchange rates, and the large difference in symmetry with respect to the water proton frequency between CEST and MTC, DS. Alternative patterns can be chosen which produce more oscillations of MTC and DS per LOVARS Unit. However this 4-point pattern is used based on its simplicity and efficiency (4 images produce 1 oscillation of CEST contrast and 2 oscillations of MTC and DS), which facilitates the dynamic monitoring of CEST contrast in some applications. This sequence was tested first using L-arginine, because at 1.8 ppm (L-arginine's main chemical shift) there is a significant amount of DS (~15%), which is similar to in vivo brain tumor studies illustrated in FIGS. 1B and 3A, where both MTC and CEST are present within one voxel.

For determining appropriate $t_{sat}$ values for the LOVARS scheme, both simulations and experimental phantom data were used on multiple concentrations of L-arginine and agar, as illustrated in FIGS. 3B-3D. To cosine modulate the water signal, $T_{sat,1}$=4 s and $T_{sat,2}$=1.5 s, which allowed the patterns in FIGS. 4I and 4K to be produced. As mentioned above, several LOVARS maps can be created using this imaging scheme: a real component map, an imaginary component map and a phase map. The phase map was found to be the least sensitive to $B_0$ inhomogeneity, and can be used to differentiate CEST from MT and DS. $B_0$ variation distorts the magnitude of the oscillations in LOVARS, illustrated in FIG. 3E, but produces very slight changes in the phase, illustrated in FIG. 3F. For voxels with only MT and/or DS, the phase remains nearly the same as $B_0$ varies from ~1.6 ppm to 1.6 ppm for Agar, illustrated in FIGS. 5A and 5B. For voxels possessing CEST contrast the phase remains within the CEST phase range, provided the offset of the saturation pulse is such that the pulse at least partially saturates the exchangeable protons. As such, the width at half height of the CEST contrast peak determines the tolerance to $B_0$ shifts. For our phantom using $B_1$=3.8 μT, the width was ~0.8 ppm, illustrated in FIG. 3A. Provided the $B_0$ variation over the image is less than this, the images produced were very clean, as illustrated in FIG. 4G.

Another benefit of the LOVARS method is that it significantly reduces the Specific Absorption Rate (SAR) compared to OIC by decreasing the duty cycle. For our phantom experiments, the duty cycle for 1 LOVARS Unit (4 scans) is 45% less than for OIC, and for in vivo the duty cycle of LOVARS is 58% less than the OIC duty cycle.

One feature of the LOVARS phase map is that the phase is insensitive to concentration and exchange rate, as is shown for the 4 different L-arginine concentrations in FIGS. 4A-4L and for the PLL data in FIG. 5F. Here fourfold changes in concentration and 16-fold changes in the exchange rate result in relative small changes in the LOVARS phase (φ) which are very small (<10%). For the same samples, the $MTR_{asym}$ varies from 4 to 40% as shown in Supporting Information FIG. S2 (>90% change). This is because of the relationship of phase to PTR, with $\tan(\phi) = MTR_{asym}(T_{sat,1})/MTR_{asym}(T_{sat,1})$ which results in removal of the prefactor $$\frac{k_{sw} \times \alpha \times X_s}{R_{1w} + k_{sw} \times X_s},$$

in Eq. 3. This leads to the phase being less sensitive to the exchange rate ($k_{sw}$), concentration ($X_s$) and water relaxation times, although the absolute value of the phase may still exhibit small changes in particular with water $T_2$, as illustrated in FIGS. 5C-5F. In addition, the projection from $\tan(\phi)$ to φ also diminishes the sensitivity. If this insensitivity is undesirable, the LOVARS phase filtered imaginary map can be displayed and this is sensitive to concentration and exchange rate.

Based on the robustness of the scheme, in vitro, the testing progressed to testing in mice. APT imaging of 9L brain tumors was chosen, as the APT contrast is well characterized, (~5% CEST contrast between tumor and normal tissue) and also because APT imaging of brain tumors is the first clinical application of CEST imaging, having been applied to more than 12 patients. This scheme was optimized on 3 mice, with several representative images shown in FIGS. 7A-7G and 8A-8D. The LOVARS phase is significantly different between tumor and control tissue, as shown in the data included in Table 2, and the phase map is less sensitive to $B_0$ than the standard $MTR_{asym}$ map, as illustrated in FIGS. 7C, 7E, and 7F. The LOVARS phase threshold had to be modified to exclude pixels with $-3\pi/4 < \phi < \pi/4$, because normal white and gray matter produced a negative $MTR_{asym}$ at the power levels used and thus in tumors the total $MTIL_{asym}$ is either less negative or slightly positive. Based on all the images obtained, the $B_0$ correction range within LOVARS images was ~±0.35 ppm in vivo, above which normal brain tissue started to show contrast, compared to the ~0.8 ppm for the phantom. As a result, LOVARS is well suited for brain imaging as $B_0$ shifts are expected to not exceed this range for mouse brains at this field and for human brains at fields of 7T or lower.

The LOVARS phase maps compared favorably to both the conventional APT image obtained using OIC and the Gd-enhanced image. Meaningful differences were not found between the FFT or GLM methods, as illustrated in FIGS. 7E and 7F, although this might change for other applications. In addition, the maps produced by this scheme possess a much higher CNR, illustrated in FIGS. 8A-8D and shown in the data of Table 1, above, than conventional $MTR_{asym}$ maps due to the acquisition of more LOVARS Units and the time domain post-processing, allowing each pair of images to contribute to the total CNR of the maps. Further alternative LOVARS schemes can be used to reduce scanning time, $B_0$ sensitivity, and improve the further quantitative capabilities.

An example using an exogenous CEST agent and using endogenous CEST agent in an animal tumor model using one representative variation of the method as well as the disclosure of the detailed mathematics and documentation superiority of the claimed improvements over existing method is included below as an illustration, not contrived to limit the scope of the application to detection, imaging and quantification of naturally occurring CEST and PARACEST agent which may be used to characterize tumor and monitor therapy, intracellular glycolytic or metabolic process, detect cell apoptosis, confirm delivery of CEST labeled diagnostic or therapeutic payload in nanoparticles and CEST material in functional tissue such as kidney, liver or cartilage.

The many features and advantages of the invention are apparent from the detailed specification, and thus, it is intended by the appended claims to cover all such features and advantages of the invention, which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

Although the present invention has been described in connection with preferred embodiments thereof, it will be appreciated by those skilled in the art that additions, deletions, modifications, and substitutions not specifically described may be made without departing from the spirit and scope of the invention as defined in the appended claims.

What is claimed is:

1. A method for obtaining a magnetic resonance image (MRI) or spectrum, comprising:
   performing a chemical exchange saturation transfer (CEST) labeling experiment or a conventional magnetization transfer (MT) labeling experiment of a subject using an MRI machine;
   constructing a multi-parametric varied saturation scheme applied by the MRI machine for performing the CEST labeling experiment or the conventional MT labeling experiment of the subject;
   generating data from the CEST or conventional MT MRI experiment;
   transmitting the data to a data processing unit;
   processing the data to generate a visual representation of the data;
   processing the data generated from the CEST experiment separately from other sources of signal loss that create image contrast;
   processing the data generated for each of a parameter of the multi-parametric saturation scheme separately;
   processing asymmetry in a magnetization transfer ratio for the data generated from the CEST experiment for each of the parameters of the multi-parametric saturation scheme, such that a difference between the magnetization transfer ratio for each of the parameters of the multi-parametric saturation scheme results in a transformed signal in a frequency domain for the multi-parametric saturation scheme; and,
   generating a second visual representation of the data based on the processing of the data.

2. The method of claim 1 further comprising processing the data to generate a multi-dimensional multi-parametric fingerprint pattern to specifically describe the CEST or Para-CEST or MT moiety, comprising one of a group consisting of 2D or 3D contrast maps, a multi-parametric characterized graph, and a quantitative characterized parameter.

3. The method of claim 1 further comprising constructing the multi-parametric varied saturation scheme with a Length ($t_{sat}$) and an Offset ($\Delta\omega$) VARied Saturation (LOVARS) scheme applied to a saturation pulse or a serial saturation pulse sequence.

4. The method of claim 1 further comprising constructing the multi-parametric varied saturation scheme with a Length ($t_{sat}$) VARied Saturation (L-VARS) scheme applied to a saturation pulse or a serial saturation pulse sequence.

5. The method of claim 1 further comprising constructing the multi-parametric varied saturation scheme with the Number of pulses ($N_{sat}$) and an Offset ($\Delta\omega$) VARied Saturation (NOVARS) scheme applied to a serial saturation pulse sequence.

6. The method of claim 1 further comprising constructing the multi-parametric varied saturation scheme with the Number of pulses ($N_{sat}$) VARied Saturation (N-VARS) scheme applied to a serial saturation pulse sequence.

7. The method of claim 1 further comprising constructing the multi-parametric varied saturation scheme with a Power ($B_1$) and an Offset ($\Delta\omega$) VARied Saturation (POVARS) scheme applied to a saturation pulse or a serial saturation pulse sequence.

8. The method of claim 1 further comprising constructing the multi-parametric varied saturation scheme with a Power ($B_1$) VARied Saturation (P-VARS) scheme applied to a saturation pulse or a serial saturation pulse sequence.

9. The method of claim 1 further comprising constructing the multi-parametric varied saturation scheme with a Modulation frequency ($\omega_s$) and an Offset ($\Delta\omega$) VARied Saturation (MOVARS) scheme applied to a saturation pulse or a serial saturation pulse sequence generating multiple frequencies simultaneously.

10. The method of claim 1 further comprising constructing the multi-parametric varied saturation scheme with a Modulation frequency ($\omega_s$) and a Length ($t_{sat}$) VARied Saturation (M-LVARS) scheme applied to a saturation pulse or a serial saturation pulse sequence generating multiple frequencies simultaneously.

11. The method of claim 1 further comprising constructing the multi-parametric varied saturation scheme with a Modulation frequency ($\omega_s$) and a Length ($t_{sat}$) and an Offset VARied Saturation (M-LOVARS) scheme applied to a saturation pulse or a serial saturation pulse sequence generating multiple frequencies simultaneously.

12. The method of claim 1 further comprising constructing the multi-parametric varied saturation scheme with a Modulation frequency ($\omega_s$) and the number of pulses ($N_{sat}$) VARied Saturation (M-NVARS) scheme applied to a saturation pulse or a serial saturation pulse sequence generating multiple frequencies simultaneously.

13. The method of claim 1 further comprising constructing the multi-parametric varied saturation scheme with a Modulation frequency ($\omega_s$) and the number of pulses ($N_{sat}$) and an Offset VARied Saturation (M-NOVARS) scheme applied to a saturation pulse or a serial saturation pulse sequence generating multiple frequencies simultaneously.

14. The method of claim 1 further comprising constructing the multi-parametric varied saturation scheme with a Modulation frequency ($\omega_s$) and an Power (B1) and an Offset VARied Saturation (M-POVARS) scheme applied to a saturation pulse or a serial saturation pulse sequence generating multiple frequencies simultaneously.

15. The method of claim 1 further comprising constructing the multi-parametric varied saturation scheme with a Modulation frequency ($\omega_s$) and an Power (B1) VARied Saturation (M-PVARS) scheme applied to a saturation pulse or a serial saturation pulse sequence generating multiple frequencies simultaneously.

16. The method of claim 1 further comprising identifying a CEST moiety specific pattern using a pattern recognition method such as principal component analysis, independent component analysis and fuzzy analysis.

17. The method of claim 1 further comprising identifying a CEST moiety specific pattern using a general linear model.

18. The method of claim 1 further comprising identifying a CEST moiety specific pattern and separating different frequency components using a fast fourier transform (FFT).

19. The method of claim 1 further comprising enhancing the detection of the CEST signal and separation from noise and artifacts using the multi-parametric varied saturation scheme and a pattern recognition method such as principal component analysis, independent component analysis and fuzzy analysis.

20. The method of claim 1 further comprising generating a new CEST moiety specific signature through a multi-dimensional contrast map, a multi-dimensional graph or a characteristic parameter by using the multi-parametric varied saturation scheme and a pattern recognition method such as principal component analysis, independent component analysis and fuzzy analysis.

21. The method of claim 1 further comprising extracting a weak contrast or a new feature by performing at least one subtraction or division of the acquired images and parameters or by acquiring a reference image for a baseline.

22. The method of claim 5 further comprising acquiring a series of images using one or more units of the multi-parametric varied saturation scheme, with one or more images within each unit of the multi-parametric varied saturation scheme.

23. The method of claim 1 further comprising selecting one or more offsets on a same side with respect to water and on resonance with an exchangeable proton and one or more offsets on an opposite side of water from the exchangeable protons.

24. The method of claim 1 further comprising selecting one or more offsets on a same side with respect to water and on resonance with one selected from a group consisting of an exchangeable proton and one or more offsets on an opposite side of water from the exchangeable protons.

25. The method of claim 1 using a saturation pulse to saturate the subject in a spatially and temporally selective method using a multi-transmitter and a multi-receiver platform.

26. The method of claim 1 further comprising acquiring at least one of a voxel, part of an image, one or more slices of a multislice 2D or 3D acquisition.

27. A method for obtaining a magnetic resonance image (MRI) or spectrum, comprising:
    performing a chemical exchange saturation transfer (CEST) labeling experiment or a conventional magnetization transfer (MT) labeling experiment of a subject using an MRI machine;
    constructing a saturation scheme with a Length ($t_{sat}$) and an Offset ($\Delta\omega$) VARied Saturation (LOVARS unit) applied by the MRI machine for performing the CEST labeling experiment or the conventional MT labeling experiment of the subject, wherein the length and offset are varied within each LOVARS unit;
    generating data from the CEST or conventional MT MRI experiment;
    transmitting the data to a data processing unit;
    processing the data to generate a visual representation of the data;
    processing the data generated from the CEST experiment separately from other sources of signal loss that create image contrast;
    processing the data generated for each of a parameter of the LOVARS unit separately;
    processing asymmetry in a magnetization transfer ratio for the data generated from the CEST experiment for each of the parameters of the LOVARS unit, such that a difference between the magnetization transfer ratio for each of the parameters of the multi-parametric saturation scheme results in a transformed signal in a frequency domain for the LOVARS unit, and,
    generating a second visual representation of the data based on the processing of the data.

* * * * *